United States Patent
Ikeda et al.

[11] Patent Number: 6,022,462
[45] Date of Patent: Feb. 8, 2000

[54] DC SPUTTERING SYSTEM

[75] Inventors: Etsuro Ikeda; Itaru Suzuki; Yuji Kawana, all of Miyagi, Japan

[73] Assignee: Sony Corporation, Tokyo, Japan

[21] Appl. No.: 08/883,361

[22] Filed: Jun. 26, 1997

[30] Foreign Application Priority Data

Jul. 2, 1996 [JP] Japan .................................. P08-172386

[51] Int. Cl.⁷ .......................... C23C 14/34; C23C 14/50
[52] U.S. Cl. .................. 204/298.15; 204/192.2; 204/192.22; 204/192.23; 204/298.11; 204/298.28
[58] Field of Search .................. 204/192.12, 192.15, 204/192.16, 192.2, 192.22, 192.23, 298.11, 298.15, 298.27, 298.28; 118/730

[56] References Cited

U.S. PATENT DOCUMENTS

| | | | |
|---|---|---|---|
| 4,714,594 | 12/1987 | Mircea | 118/730 |
| 4,745,878 | 5/1988 | Sagawa | 204/298.11 X |
| 4,756,811 | 7/1988 | Takeoka et al. | 204/192.26 |
| 4,869,802 | 9/1989 | Wirz et al. | 204/298.15 |
| 5,092,978 | 3/1992 | Kojima et al. | 204/298.15 |
| 5,589,040 | 12/1996 | Nishimura | 204/192.23 |
| 5,643,687 | 7/1997 | Iketani et al. | 204/192.2 |
| 5,738,765 | 4/1998 | Ohta et al. | 204/192.2 |
| 5,753,091 | 5/1998 | Weber et al. | 204/298.11 |

FOREIGN PATENT DOCUMENTS

| | | | |
|---|---|---|---|
| 569660 | 11/1993 | European Pat. Off. | 204/298.15 |
| 0 725 162 A2 | 8/1996 | European Pat. Off. | |
| 61-201443 | 9/1986 | Japan | |
| 0136238 | 6/1987 | Japan | 204/298.15 |
| 01017865 | 1/1989 | Japan | |
| 1298161 | 12/1989 | Japan | 204/298.15 |
| 1298162 | 12/1989 | Japan | 204/298.15 |
| 2080568 | 3/1990 | Japan | 204/298.15 |
| 03191061 | 8/1991 | Japan | |
| 405009726 | 1/1993 | Japan | 204/298.15 |
| 05320900 | 12/1993 | Japan | |
| 08045121 | 2/1996 | Japan | |

OTHER PUBLICATIONS

"Thin Film Process", Vossen et al., Academic Press, p. 41, 1978.

*Primary Examiner*—Rodney G. McDonald
*Attorney, Agent, or Firm*—Hill & Simpson

[57] ABSTRACT

A DC sputtering system improved in prevention of fusion of a substrate and electric corrosion of a pallet revolving shaft due to the flow of negative electric charges at the time of production of an optical disk. The system includes a pair of electrodes, a negative electrode and a positive electrode, wherein the negative electrode is composed of a target plate made from a target material such as Si and a backing plate on which the target plate is fixedly placed, and the positive electrode is composed of a pallet disposed opposite to the negative electrode. A substrate of an optical disk is mounted on the positive electrode side through a disk base using an inner peripheral mask and an outer peripheral mask. Each of the inner peripheral mask and the outer peripheral mask is made from or covered with an electrically insulating material such as teflon or ceramic. This prevents the flow of negative electric chargers from being concentrated at the inner peripheral mask and the outer peripheral mask, to thereby protect the substrate from being fused.

4 Claims, 7 Drawing Sheets

ARC GENERATION POINT

DC SPUTTERING SYSTEM

BACKGROUND OF THE INVENTION

The present invention relates to a DC sputtering system, and particularly to a DC sputtering system improved in prevention of fusion of an optical recording medium and electric corrosion of a pallet revolving shaft due to the flow of negative electric charges at the time of production of the optical recording medium.

First, a related art sputtering system will be described with reference to FIGS. 5 to 8. FIG. 5 is a view showing a schematic configuration of the related art sputtering system; FIG. 6 is a schematic view illustrating a portion of the related art sputtering system, which corresponds to an improved portion of the present invention; FIG. 7 is a view illustrating fusion of a substrate of the related art sputtering system; and FIGS. 8A, 8B are views illustrating damages of a revolving shaft of a revolving type pallet, wherein FIG. 8A is a sectional view of the revolving type pallet and FIG. 8B is an enlarged sectional view of the revolving shaft.

Optical recording media (hereinafter, referred to as "optical disks") have been generally produced by a sputtering process. In the sputtering process, a target material is taken as a negative electrode, and both a substrate mounting pallet disposed opposite to the target material and a vacuum chamber housing are electrically earthed. At this time, positive ions in plasma flow toward the cathode target, and electrons flow toward the earth through the pallet, a mask fixing the substrate of the optical disk to the pallet, and the chamber housing. In general, a substrate mounting station (hereinafter, referred to as a "disk base") is provided on the surface of the pallet, and the substrate is fixed on the disk base using the mask which is composed of an inner peripheral mask and an outer peripheral mask.

Optical disks include a photomagnetic disk having a recording film made from a rare earth metal/a transition metal and a phase change disk having a recording film made from GeSbTe or the like. In general, such an optical disk is of a multi-layered structure in which a recording layer is held between dielectric layers. Further, with respect to a reproducing disk, there has been proposed a type having a multi-layered structure called a very high resolution structure, in which a mask layer and a dielectric layer are disposed between a substrate and a reproducing reflection layer. Here, as the dielectric material, there is generally used one kind selected from a group consisting of SiN, AlN, TiO, and oxides and nitrides of Si, Al, Ta, Ti and alloys thereof.

In production of an optical disk having a dielectric layer, there is a tendency to form the dielectric layer by DC sputtering. This is because the formation of the dielectric layer by RF reactive sputtering or the like takes a lot of time. Optical disks are sequentially produced using DC sputtering by repeating the following steps of mounting a substrate on a pallet with a substrate fixing mask; putting such a pallet in a film forming vacuum chamber, followed by sequential formation of a dielectric film, recording film, and the like on the substrate; dismounting the substrate from the pallet outside the vacuum chamber; and putting the pallet on which a new substrate is mounted, into the vacuum chamber.

The concrete configuration and schematic operation of a DC sputtering system used for producing optical disks will be described with reference to FIG. 5.

A DC sputtering system 50 includes a vacuum chamber 1 as a film formation chamber; a vacuum control unit 2 for controlling a vacuum condition of the interior of the vacuum chamber 1; a DC high voltage power source 3 for plasma discharging; a sputtering cathode unit 5 connected to the DC high voltage power source 3 through a power supply line 4; a pallet 6 disposed opposite to the sputtering cathode unit 5 in such a manner as to be spaced therefrom at a specific distance; and a sputter gas supply unit 7 for supplying a sputter gas such as Ar into the vacuum chamber 1.

The sputtering cathode unit 5 includes a target plate 8, a backing plate 9, and a magnet system 10. The target plate 8, which functions as a negative electrode, is made from a target material such as Si. The target plate 8 is fixedly placed on the backing plate 9. The magnet system 10 is disposed behind the backing plate 9. The target plate 8 and the pallet 6 functioning as a positive electrode constitute a pair of electrodes. A substrate 11 of an optical disk such as a photomagnetic disk on which a film is to be formed, is mounted on the pallet 6 opposite to the sputtering cathode unit 5 using an inner peripheral mask 12 and an outer peripheral mask 13, with a disk base 14 put between the substrate 11 and the pallet 6.

The operation of the DC sputtering system 50 will be described below. First, the interior of the vacuum chamber 1 is evacuated to a desired degree of vacuum, for example, to a value of $1 \times 10^{-4}$ Pa or less by the vacuum control unit 2. Subsequently, a sputter gas, for example, a mixed gas of Ar and $N_2$ is introduced into the vacuum chamber 1 to a specific pressure by the sputter gas supply unit 7. A specific negative voltage is applied, in such state, to the backing plate 9, that is, the target plate 8 from the DC high voltage power supply 3. An electric field is thus generated between the pallet 6 and the backing plate 9 which form the pair of electrodes, to generate a glow discharge. The Ar gas is ionized by glow discharge, and ions of the Ar gas bombard with the target plate 8. As a result, atoms or the like of the target material are sputtered from the target plate 8, and deposited on the surface of the substrate 11 mounted on the pallet 6 disposed opposite to the target plate 8, to thereby form a thin film made from SiN.

FIG. 6 shows a current flow path within the vacuum chamber 1 upon sputtering. As described above, when the electric field is generated between the pallet 6 and the target plate 8, ions of the Ar gas (inert gas) are bombarded with the target plate 8 and thereby target atoms are sputtered from the target plate 8. The target atoms are deposited on the surface of the substrate 11, and negative electric charge such as electrons, which are simultaneously generated, flow from the pallet 6 as an anode to the earth through the inner peripheral mask 12, outer peripheral mask 13, and the wall of the vacuum chamber 1.

However, as shown in FIG. 7, when an insulating layer 19 such as SiN film is overlappingly deposited on the pallet 6 with the increasing frequencies of working of pallet 6, the flow of negative electric charges such as electrons generated during sputtering tends to be cutoff by the deposited insulating layer 19. The flow of the negative electric charges is thus concentrated at the inner peripheral mask 12 and the outer peripheral mask 13 each of which is made from stainless steel or the like. More concretely, the negative electric charges flow toward the earth through portions where the inner peripheral mask 12 and the outer peripheral mask 13 are brought in contact with the disk base 14.

As a result, although the usual sputtering generates only a temperature rise of about 50° C., the temperature of each of the inner peripheral mask 12 and the outer peripheral mask 13 exceeds a glass transition temperature (140° C.) of the substrate 11. The substrate 11 is thus fused at the portions where the substrate 11 is brought in contact with the inner peripheral mask 12 and the outer peripheral mask 13, to form substrate fusion portions 20. This allows the optical disk to cause defects such as an abnormality in double refraction.

The related art system also presents another problem. Referring to FIG. 6, as the frequencies of working of the pallet 6, inner peripheral mask 12, and outer peripheral mask 13 are increased for repeatedly producing optical disks, a dielectric film, metal film, and the like tend to be deposited on the surfaces thereof, so that the pallet 6, inner peripheral mask 12, and outer peripheral mask 13 are electrically insulated. However, since the inner peripheral mask 12 and the outer peripheral mask 13 are brought in contact with a substrate mounting/dismounting unit upon mounting/ dismounting of the substrate 11, the films deposited on the surfaces of the masks 12, 13 are removed, with a result that a non-insulating portion is formed on part of the surface of each mask. If DC sputtering is performed for forming a dielectric layer in such a state, the surface of the pallet 6 is insulated and thereby electrified, to be thus suppressed in incidence of electrons; however, the non-insulating portions of the surfaces of the masks 12, 13 are concentratedly bombarded with electrons.

The temperatures of the inner peripheral mask 12 and the outer peripheral mark 13 are thus excessively increased. If these temperatures exceed the melting point of the substrate 11, the substrate 11 is fused and the characteristics of the optical disk are degraded by changes in double refraction.

In the case of using a revolving type pallet, there arises the following problem.

FIG. 8(*a*) is a sectional view of a revolving type pallet. The pallet 6 is fixed on a pallet holder 21 rotatably held by a carrier 15 through a bearing 22 and a bearing housing 23. The revolving force is introduced through a magnet coupling 24.

The revolving type pallet uses the bearing 22 as a revolving portion as described above, so that electrons impinging on the pallet 6 pass through the bearing housing 23, and flow toward the bearing housing 23 through an outer race of the bearing, balls, and inner race of the bearing, and they flow toward the earth through the carrier 15. At this time, there occurs electric interruption between the balls and the inner and outer races of the bearing 22 because of the presence of grease therebetween and revolution of the balls, so that if the carrier 15 is not insulated, arc discharges are generated at portions shown in FIG. 8B. The portions at which arc discharges have generated are susceptible to electric corrosion, causing a revolving failure of the pallet 6. The same is true for the case that a rotating mechanism is provided on a chamber main body.

SUMMARY OF THE INVENTION

An object of the present invention is to provide a sputtering system intended to prevent the flow of negative electric charges such as electrons to an inner peripheral mask and an outer peripheral mask for fixing a substrate even when an insulating film such as a SiN film is deposited on a pallet as an anode, and hence to remove a problem such as fusion of the substrate and produce an optical disk having a stable quality; and to provide an optical disk produced using the sputtering system.

Another object of the present invention is to provide a sputtering system intended to form a dielectric film at a high speed using DC sputtering by suppressing electrons from being concentratedly bombarded to masks even when an optical disk is produced using a pallet and masks which have been both frequently worked, and hence to eliminate the necessity of frequent exchange of the pallet and produce the optical disk at a stable quality; and to provide an optical disk produced using the sputtering system.

A further object of the present invention is to provide a sputtering intended to prevent, in the case of using a revolving type pallet, occurrence of electric corrosion due to the flow of a current through a bearing constituting a revolving shaft of the pallet and produce a revolving type optical disk while keeping a stable revolving function of the pallet for a long period.

To achieve the above object, according to a first aspect of the present invention, there is provided a DC sputtering system for forming an optical recording medium having at least one or more kinds of dielectric films, including: a mask for fixing a substrate of the optical recording medium on a pallet of the DC sputtering system, the mask being formed of or covered with an electrically insulating member.

The electrically insulating member may be made from a ceramic or a high polymer material.

According to a second aspect of the present invention, there is provided a DC sputtering system for forming an optical recording medium having at least one or more kinds of dielectric films, including: a pallet for fixing a substrate of the optical recording medium, a carrier for fixing the pallet, and a disk base for mounting the substrate on the pallet, wherein at least one of the pallet, the carrier and the disk base is electrically insulated.

In the DC sputtering system of the present invention, each of the inner peripheral mask and the outer peripheral mask for fixing a substrate on a pallet is made from an insulating material such as ceramic or teflon™ (polytetrafluoroethylene), and accordingly even when an insulating layer such as an SiN film is deposited on the surface of the pallet as an anode, it is possible to prevent the flow of negative electric charges such as electrons generated during sputtering to the inner peripheral mask and the outer peripheral mask, and hence to protect fusion of the substrate.

For the DC sputtering system using a revolving type carrier, it is possible to prevent negative electric charges from flowing between the pallet and the earth through a bearing of the revolving shaft of the pallet, and hence to prevent electrons from being bombarded with the inner peripheral mask and an outer peripheral mask during sputtering. This is effective to protect the fusion of an optical disk due to a temperature rise of each of the inner peripheral mask and outer peripheral mask. Further, since negative electric charges do not flow to the bearing, it is possible to prevent occurrence of the electric corrosion of the bearing and hence to keep constant the revolution of the pallet.

BRIEF DESCRIPTION OF THE DRAWINGS

The invention will be more particularly described with reference to the accompanying drawings, in which:

FIGS. 8A, 8B are views illustrating damages of a revolving shaft of a revolving type pallet, wherein FIG. 8A is a sectional view of the revolving type pallet, and FIG. 8B is an enlarged sectional view of the revolving shaft.

DETAILED DESCRIPTION OF THE PREFERRED EMBODIMENTS

Figure 1:
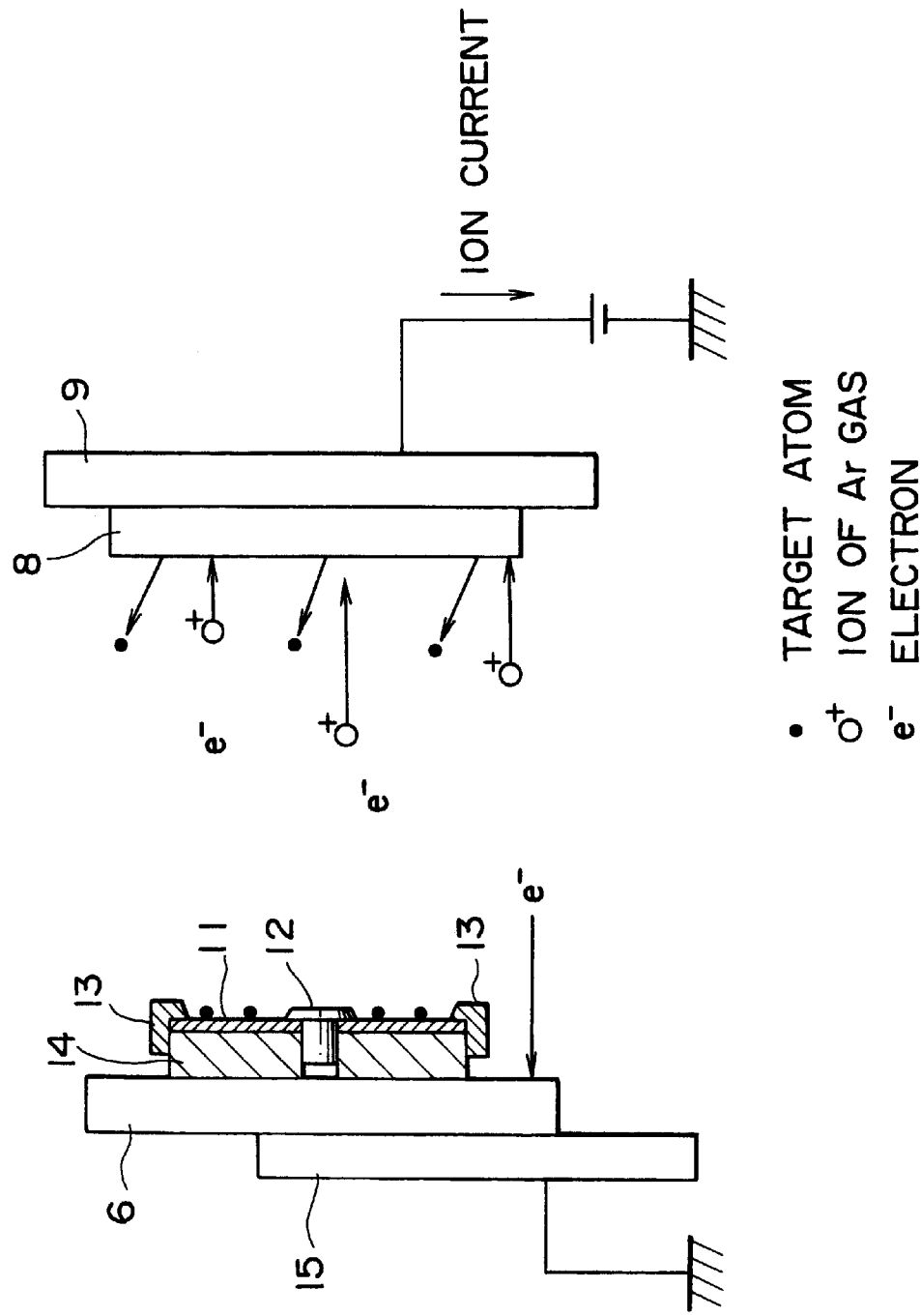
FIG. 1 is a sectional view of a first embodiment of a sputtering system of the present invention.
Figure 2:
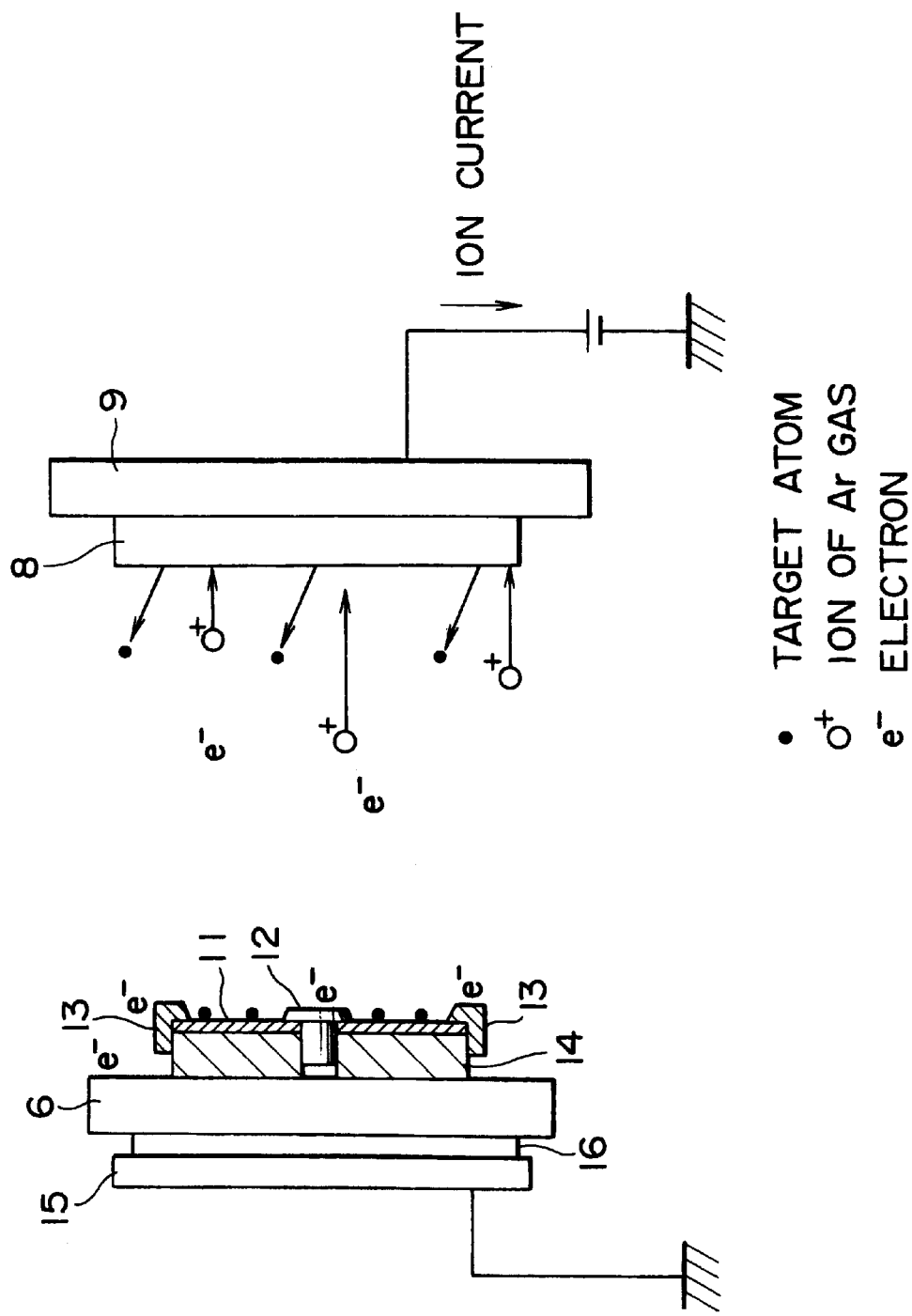
FIG. 2 is a sectional view of a second embodiment of the sputtering system of the present invention.
Figure 3:
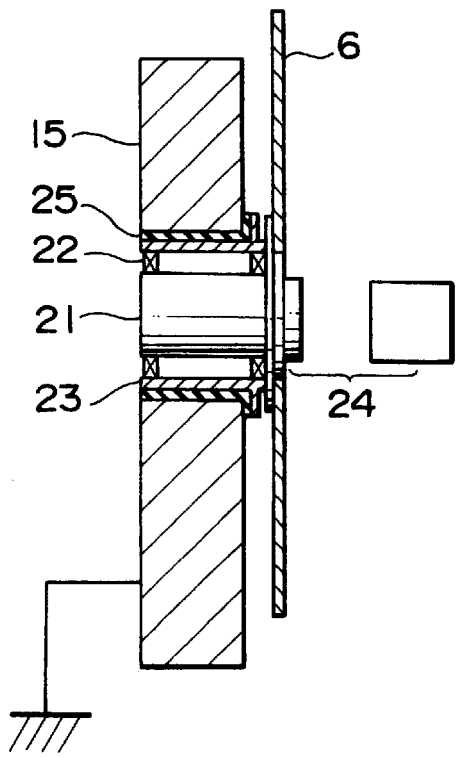
FIG. 3 is a sectional view of a third embodiment of the sputtering system of the present invention.
Figure 4:
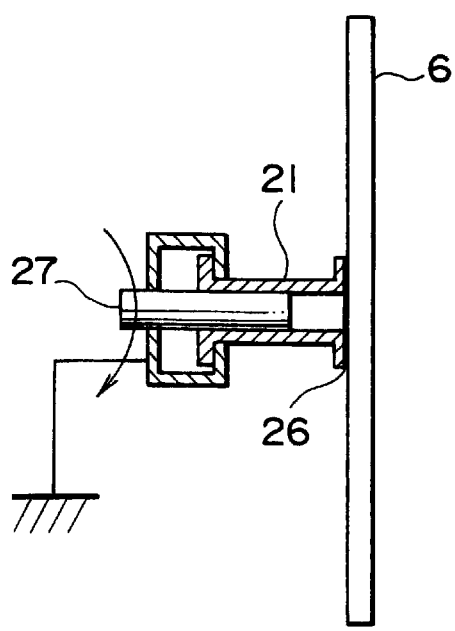
FIG. 4 is a sectional view of a fourth embodiment of the sputtering system of the present invention.

Hereinafter, preferred embodiments of a sputtering system of the present invention will be described with reference to FIGS. 1 to 4. FIG. 1 is a sectional view of a first embodiment; FIG. 2 is a sectional view of a second embodiment; FIG. 3 is a sectional view of a third embodiment; and FIG. 4 is a sectional view of a fourth embodiment.

Embodiment 1

Figure 5:
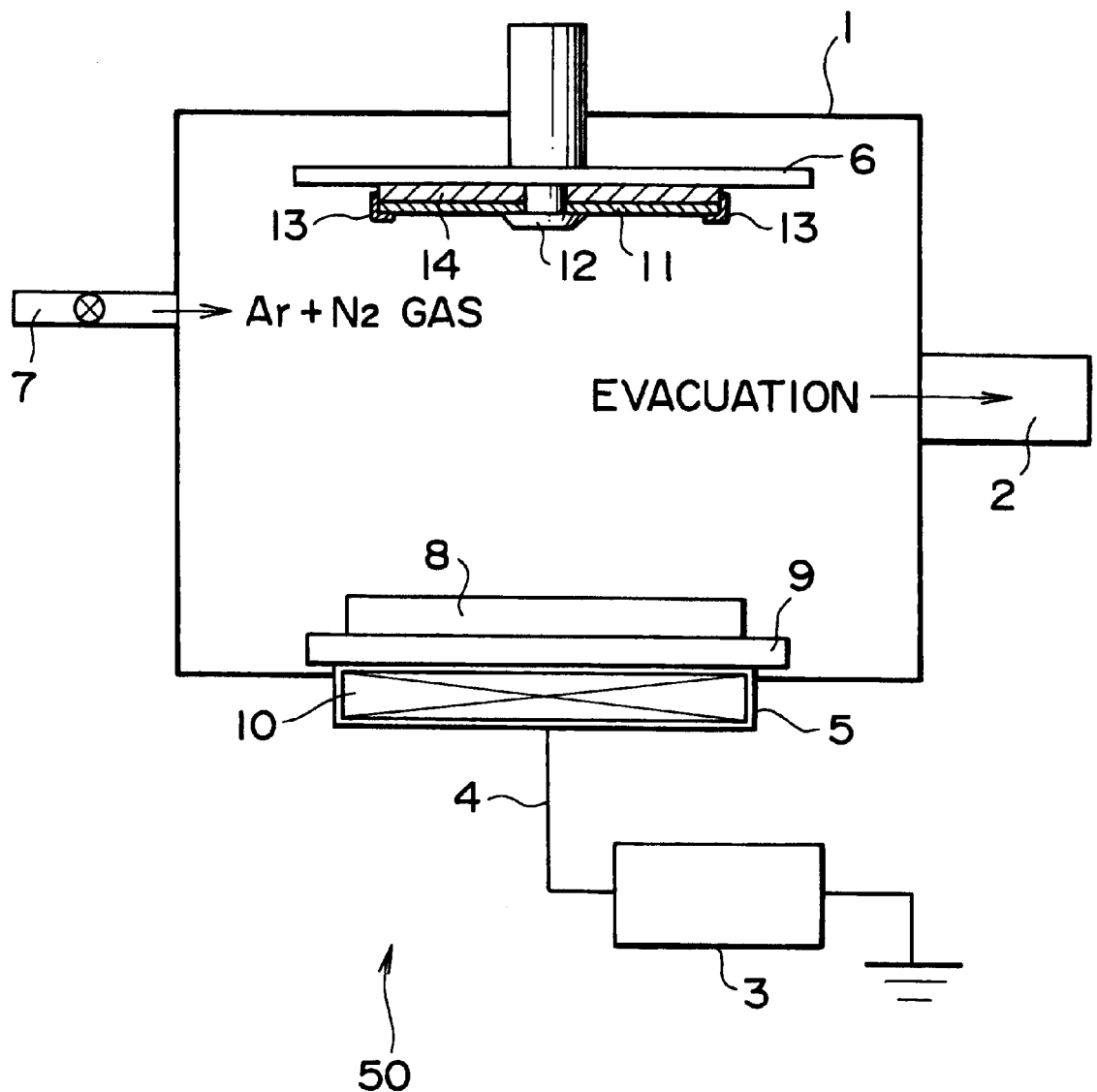
FIG. 5 is a view showing a schematic configuration of a related art sputtering system.
Figure 6:
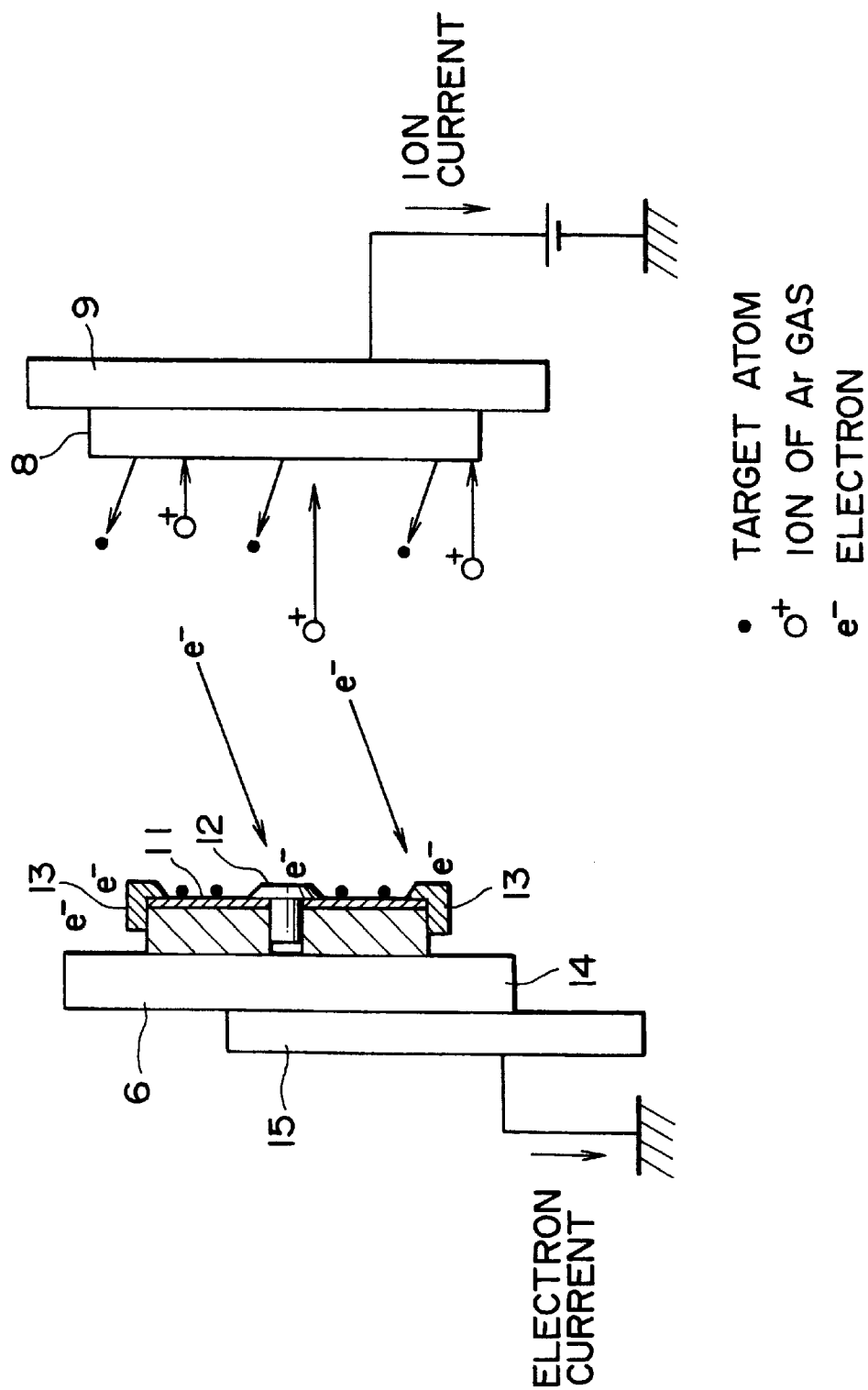
FIG. 6 is a schematic view illustrating a portion of the related art sputtering system, which corresponds to an improved portion of the present invention.
Figure 7:
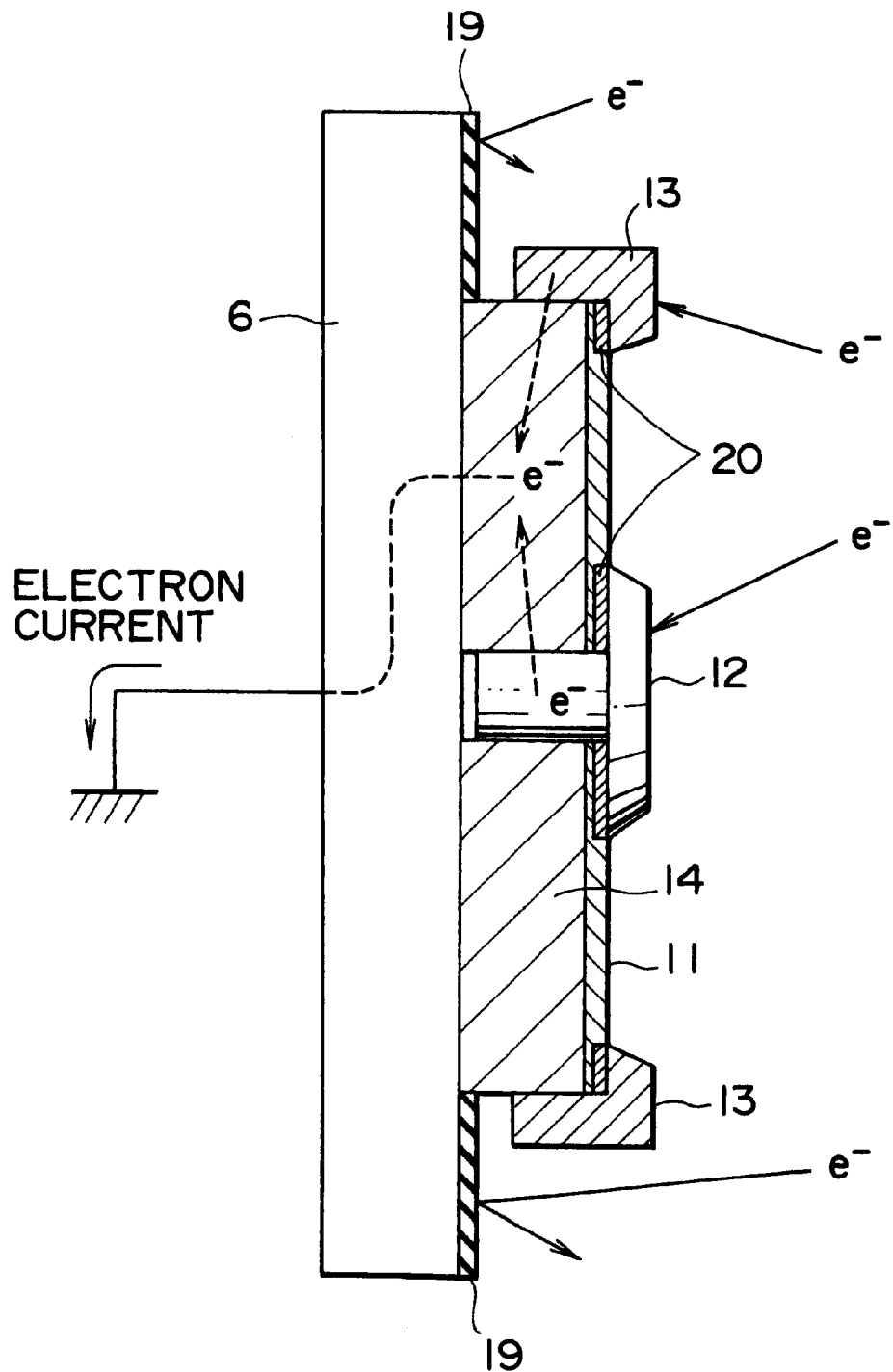
FIG. 7 is a view illustrating the fusion of a substrate of the related art sputtering system.
Figure 8A:
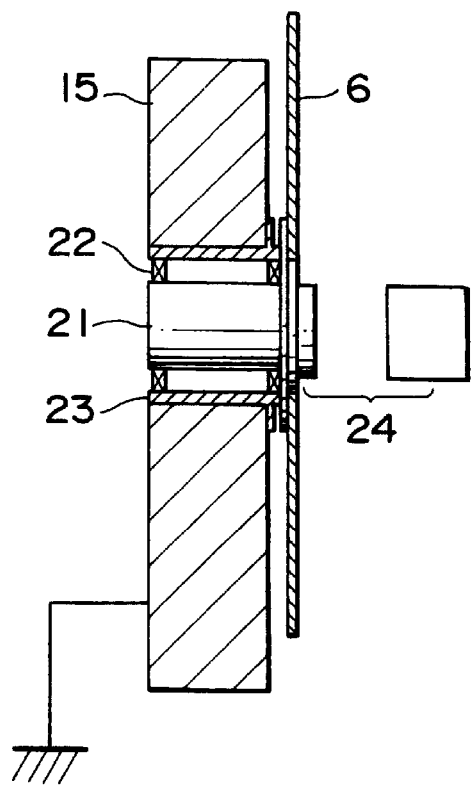
Figure 8B:
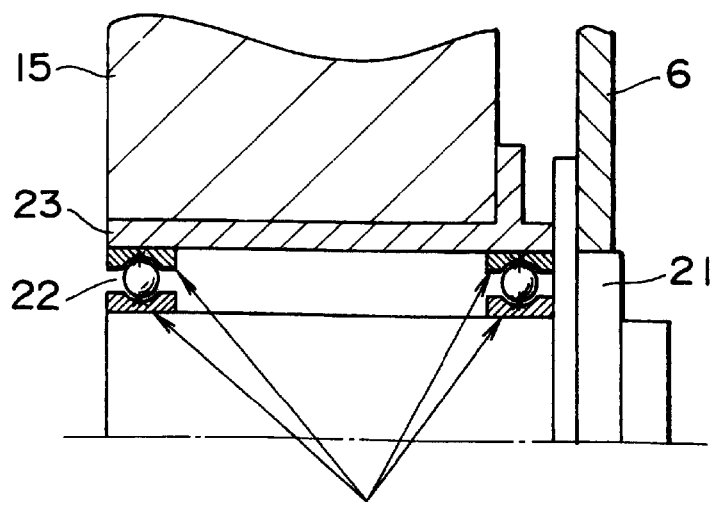

FIG. 1 shows an essential portion of the first embodiment of the sputtering system of the present invention. In this embodiment, parts corresponding to those described with reference to FIG. 5 are indicated by the same reference numerals, and the explanation thereof is omitted.

The sputtering system has a pair of electrodes, a negative electrode and a positive electrode. The negative electrode is composed of a target plate 8 made from a target material such as Si and a backing plate 9 on which the target plate 8 is fixedly placed. The positive electrode is composed of a pallet 6 disposed opposite to the negative electrode. A substrate 11 of an optical disk is mounted on the positive electrode side through a disk base 14 using an inner peripheral mask 12 and an outer peripheral mask 13.

In this embodiment, each of the inner peripheral mask 12 and the outer peripheral mask 13 is formed from or covered with an electrically insulating material such as teflon™ (polytetrafluoroethylene) or ceramic for preventing the flow of negative electric charges from being concentrated at the inner peripheral mask 12 and the outer peripheral mask 13. This is effective to protect the fusion of the substrate 11.

The system using the mask of this embodiment was measured in terms of fusion of a substrate. For comparison, the same measurement was performed for the system using the related art mask. The measurement was performed using five pieces of pallet carriers on each of which 24 pieces of substrates were mounted. The surface of each pallet 6 on which SiN dielectric films were deposited was electrically insulated from the earth. The substrate 11 was made from polycarbonate. As the sample, there was used a photomagnetic disk having a four-layer structure of SiN dielectric films formed by DC sputtering. Further, to give a state being very easy to generate fusion of the substrate 1, there was used the pallet 6 on the surface of which the four-layer structure films had been deposited in a pattern of about 300 cycles.

The measured results are shown in Table 1. As is apparent from the results, for the system using the related art mask, 2–4 pieces out of 24 pieces of the substrates mounted on each carrier are fused; while for the system using the mask of the present invention, any one of 24 pieces of the substrates is not fused.

TABLE 1

| Carrier No. | 1 | 2 | 3 | 4 | 5 |
|---|---|---|---|---|---|
| Inventive example | 0/24 | 0/24 | 0/24 | 0/24 | 0/24 |
| Comparative example | 4/24 | 3/24 | 4/24 | 2/24 | 3/24 |

Embodiment 2

FIG. 2 shows an essential portion of a second embodiment of the sputtering system of the present invention. In this embodiment, parts corresponding to those described with reference to FIG. 5 are indicated by the same reference numerals, and the explanation thereof is omitted.

The sputtering system has a pair of electrodes, a negative electrode and a positive electrode. The negative electrode is composed of a target plate 8 made from a target material such as Si and a backing plate 9 on which the target plate 8 is fixedly placed. The positive electrode is composed of a pallet 6 disposed opposite to the negative electrode. A substrate 11 of an optical disk is mounted on the positive electrode side through a disk base 14 using an inner peripheral mask 12 and an outer peripheral mask 13.

In this embodiment, a spacer 16 made from an electrically insulating material such as glass is provided between the pallet 6 and a carrier 15 for insulating the pallet 6 from the earth. With this configuration, it is possible to prevent the flow of negative electric charges from being concentrated at the inner peripheral mask 12 and the outer peripheral mask 13 and hence to protect the fusion of the substrate 11.

Embodiment 3

FIG. 3 shows an essential portion of a third embodiment of the sputtering system of the present invention. In this embodiment, parts corresponding to those described with reference to FIG. 5 are indicated by the same reference numerals, and the explanation thereof is omitted. While a substrate and the like mounted on the pallet 6 are not shown in FIG. 3, they are so configured as shown in FIG. 5.

The structure of a revolving type pallet of this embodiment is as follows. A pallet holder 21 holding the pallet 6 is rotatably supported on a bearing housing 23 on the fixed side through a bearing 22. An insulator 25 is provided between the bearing housing 23 and the carrier 15 for cutting off electric conduction therebetween. Also, a revolving force used for revolution of the pallet 6 is supplied from the exterior through a magnet coupling 24.

With this configuration, it is possible to prevent negative electric charges electrified in the pallet 6 and the like from flowing toward the earth, and hence to prevent the flow of the negative electric charges from being concentrated at the inner peripheral mask and an outer peripheral mask. This is effective to prevent the fusion of the substrate, and to prevent occurrence of electric corrosion of the bearing 22 and hence improve a revolving failure of the pallet 6. Thus, there can be prepared an optical disk having a stable quality. The insulator 25 may be made from one kind selected from a group consisting of ceramic, glass, rubber, teflon™ (polytetrafluoroethylene), or other resins such as epoxy resin.

Embodiment 4

FIG. 4 shows an essential portion of a fourth embodiment of the sputtering system of the present invention. In this embodiment, parts corresponding to those described with reference to FIG. 5 are indicated by the same characters. While a substrate and the like mounted to a pallet 6 are not shown in FIG. 4, they are so configured as shown in FIG. 5.

The structure of a revolving type pallet of this embodiment is characterized in that the pallet 6 is fixed to a pallet holder 21 through an insulator 26 for cutting off electric conduction between the body earth of the chamber and the pallet 6. The pallet holder 21 receives a revolving force used for revolution of the pallet 6 from the exterior through a revolution introducing portion.

With this configuration, it is possible to prevent negative electric charges electrified in the pallet 6 and the like from flowing toward the earth through the carrier 15, and hence to prevent the flow of the negative electric charges from being concentrated at the inner peripheral mask 12 and the outer peripheral mask 13. This is effective to protect the fusion of the substrate and hence to prepare an optical disk having a stable quality. The insulator 26 may be made from one kind selected from a group consisting of ceramic, glass, rubber, teflon™(polytetrafluoroethylene), or other resins such as epoxy resin.

The system using the mask of this embodiment was measured in terms of fusion of a substrate. For comparison, the same measurement was performed for the system using the related art mask. The measurement was performed using five pieces of pallet carriers on each of which 36 pieces of substrates were mounted. The substrate 11 was made from polycarbonate. As the sample, there was used a photomagnetic disk having a four-layer structure of SiN dielectric films formed by DC sputtering. There was used the pallet 6 on the surface of which four-layered structure films each having an insulating film of 1000 Å, a conducting layer of 200 Å, an insulating layer of 300 Å and a conducting layer of 500 Å had been deposited in a pattern of 300 cycles. Also, there were used the inner peripheral mask 12 and the outer peripheral mask 13 on the surfaces of which any film had not been formed. In the inventive example, an electric resistance between the surface of the pallet 6 and the earth was set at about 10 M Ω for giving a state of the mask being much susceptible to electron bombardment, tending to generate the fusion of the substrate.

The measured results are shown in Table 2. As is apparent from the results, for the system using the related art mask, 1–3 pieces out of 36 pieces of the substrates mounted on each carrier are fused; while for the system using the mask of the present invention, any one of 36 pieces of the substrates is not fused.

TABLE 2

| Carrier No. | 1 | 2 | 3 | 4 | 5 |
|---|---|---|---|---|---|
| Inventive example | 0/36 | 0/36 | 0/36 | 0/36 | 0/36 |
| Comparative example | 2/36 | 3/36 | 1/36 | 2/36 | 2/36 |

While the preferred embodiments of the present invention have been described using the specific terms, such description is for illustrative purposes only, and it is to be understood that changes and variations may be made without departing from the spirit or scope of the following claims.

What is claimed:

1. A DC sputtering system for forming an optical recording medium comprising an optical disk substrate having at least one dielectric film disposed thereon, said DC sputtering system comprising:
   a carrier having a cylindrical mounting aperture;
   a cylindrical insulator member having an upstanding peripheral lip at one end thereof telescopically received in said cylindrical mounting aperture so that said peripheral lip abuts a peripheral surface of the carrier adjacent the cylindrical mounting aperture;
   a cylindrical bearing housing telescopically received in the cylindrical insulator member;
   a substantially planar pallet member having a disk receiving surface and a central cylindrical shaft projecting rearwardly from the pallet member opposite the disk receiving surface, said pallet member being telescopically received in said bearing housing and rotatably mounted in said bearing housing with a plurality of bearings disposed between said shaft and said bearing housing.

2. A DC sputtering system as defined in claim 1, wherein the cylindrical insulator member comprises an insulator selected from the group consisting of: ceramic, glass, rubber, polytetrafluoroethylene and epoxy resin.

3. A DC sputtering system for forming an optical recording medium comprising an optical disk substrate having at least one dielectric film disposed thereon, said DC sputtering system comprising:
   a substantially planar pallet having a disk receiving surface and an opposing rear surface;
   an insulator member having a hollow cylindrical configuration including an upstanding peripheral lip flange at a first end thereof mounted to said rear surface and a shaft receiving opening defined therein;
   a rotatable shaft telescopically received in the shaft receiving opening through an opposed second end of the insulator member; and
   a grounded connector connecting said insulator member and said rotatable shaft.

4. A DC sputtering system as defined in claim 3, wherein the insulator member comprises an insulator selected from the group consisting of: ceramic, glass, rubber, polytetrafluoroethylene and epoxy resin.

* * * * *